(12) United States Patent
Hung

(10) Patent No.: US 7,566,970 B2
(45) Date of Patent: Jul. 28, 2009

(54) STACKED BUMP STRUCTURE AND MANUFACTURING METHOD THEREOF

(75) Inventor: Chih-Ming Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 259 days.

(21) Appl. No.: 11/535,498

(22) Filed: Sep. 27, 2006

(65) Prior Publication Data

US 2007/0262446 A1 Nov. 15, 2007

(30) Foreign Application Priority Data

May 9, 2006 (TW) .............................. 95116327 A

(51) Int. Cl.
*H01L 23/48* (2006.01)
*H01L 23/52* (2006.01)

(52) U.S. Cl. ...................... 257/737; 257/738; 438/613

(58) Field of Classification Search ......... 257/737–738, 257/780, 784, E23.021, E23.069; 438/613
See application file for complete search history.

(56) References Cited

U.S. PATENT DOCUMENTS 6,864,587 B2 * 3/2005 Shibata ...................... 257/784

* cited by examiner

Primary Examiner—Theresa T Doan
(74) Attorney, Agent, or Firm—Jianq Chyun IP Office

(57) ABSTRACT

A method for manufacturing a stacked bump structure including the following steps is provided. First, a substrate having multiple bonding pads disposed on a surface thereof is provided. Next, a first bump and a second bump are respectively formed on any two adjacent bonding pads of the substrate. Then, a third bump is formed between the first bump and the second bump by wire bonding technology, so as to make the two adjacent bonding pads electrically connected to each other through the third bump.

10 Claims, 7 Drawing Sheets

STACKED BUMP STRUCTURE AND MANUFACTURING METHOD THEREOF

CROSS-REFERENCE TO RELATED APPLICATION

This application claims the priority benefit of Taiwan application serial no. 95116327, filed on May 9, 2006. All disclosure of the Taiwan application is incorporated herein by reference.

BACKGROUND OF THE INVENTION

1. Field of Invention

The present invention relates to a bump structure and a manufacturing method thereof, and more particularly, to a stacked bump structure and a manufacturing method thereof.

2. Description of the Related Art

In the semiconductor industry, the fabrication of integrated circuits (ICs) may be roughly divided into three stages: IC design, IC process and IC packaging.

During the IC process, a chip is fabricated by making a wafer, forming ICs and dicing the wafer. Generally speaking, the wafer has an active surface, generally referred to the surface having active devices. After the fabrication of the ICs within the wafer, multiple bonding pads are formed on the active surface of the wafer, so that a chip formed by dicing the wafer is able to be electrically connected to a carrier via the bonding pads. The carrier may be, for example, a leadframe or a package substrate. The chip may be connected to the carrier through wire bonding or flip chip technology, so as to form the electrical connection between the bonding pads of the chip and the pads of the carrier for forming a chip package.

For the wire bonding technology, except for the above-mentioned method that the bonding pads of the chip are electrically connected to the pads of the carrier, two bonding pads of the chip may be electrically connected to each other through a bonding wire according to the design requirement, which is the so-called stand-off stitch bonding (SSB).

FIG. 1 is a schematic diagram showing a conventional chip using the stand-off stitch bonding. Referring to FIG. 1, a conventional chip 100 has multiple bonding pads 110 disposed on a surface 120 of the chip 100. From FIG. 1, two adjacent bonding pads 110 of the chip 100 are electrically connected to each other by using SSB. However, if the pad pitch d1 between two adjacent pads 110 is too close, the space limitation makes the bonding wire W1 curve drastically, which leads to the defect of the wire, so as to degrade the electrical performance initially designed for electrically connecting the two adjacent pads 110, even to break the circuit. Thus, the yield rate of the chip 100 is reduced.

SUMMARY OF THE INVENTION

An objective of the present invention is to provide a method for manufacturing a stacked bump structure, so as to enhance the interconnection reliability and the electrical performance between the bonding pads, and further increase the packaging density of the electronic devices.

Another objective of the present invention is to provide a stacked bump structure, which is suitable for a substrate, on which multiple bonding pads are disposed and two adjacent pads thereof are electrically connected by a bump formed between the two adjacent pads, so as to lower the thickness of the substrate.

As embodied and broadly described herein, the present invention provides a method for manufacturing a stacked bump structure. The method includes the following steps. First, a substrate is provided and multiple bonding pads are disposed on a surface of the substrate. Next, a first bump and a second bump are respectively formed on any two adjacent bonding pads of the substrate. Afterwards, a third bump is formed between the first bump and the second bump by wire bonding technology, so as to electrically connect the two adjacent bonding pads through the third bump.

According to an embodiment of the present invention, the pad pitch between the two adjacent bonding pads is less than 70 μm.

According to an embodiment of the present invention, the above-mentioned bonding pads may have the same electrical property.

According to an embodiment of the present invention, the above-mentioned substrate may be a chip.

According to an embodiment of the present invention, the above-mentioned bonding pads may be aluminum pads.

According to an embodiment of the present invention, the above-mentioned first bump may be a stud bump formed by using wire bonding technology.

According to an embodiment of the present invention, the above-mentioned second bump may be a stud bump formed by using wire bonding technology.

According to an embodiment of the present invention, the above-mentioned third bump may be a stud bump.

According to an embodiment of the present invention, all of the above-mentioned first bump, second bump and third bump may be stud bumps formed by using wire bonding technology.

According to an embodiment of the present invention, the above-mentioned first bump, second bump and third bump may be made of gold.

According to an embodiment of the present invention, the method for manufacturing a stacked bump structure further includes the following steps. After completing the above-described steps, a fourth bump is formed on another bonding pad. Thereafter, a bonding wire is formed between the third bump and the fourth bump by wire bonding technology, so as to electrically connect the another bonding pad to the above-mentioned two adjacent bonding pads through the bonding wire.

As embodied and broadly described herein, the present invention also provides a method for manufacturing a stacked bump structure. The method includes the following steps. First, a substrate is provided and multiple bonding pads are disposed on a surface of the substrate. Next, a first bump and a second bump are respectively formed on any two adjacent bonding pads of the substrate. Afterwards, a third bump is formed on another bonding pad. Thereafter, a fourth bump is formed between the first bump and the second bump and a bonding wire for connecting the third bump to the fourth bump is formed by wire bonding technology, so as to electrically connect the another bonding pad to the above-mentioned two adjacent bonding pads.

According to an embodiment of the present invention, the pad pitch between the above-mentioned adjacent bonding pads is less than 70 μm.

According to an embodiment of the present invention, the above-mentioned bonding pads may have the same electrical property.

According to an embodiment of the present invention, the above-mentioned substrate may be a chip.

According to an embodiment of the present invention, the above-mentioned bonding pads may be aluminum pads.

According to an embodiment of the present invention, the above-mentioned first bump may be a stud bump formed by wire bonding technology.

According to an embodiment of the present invention, the above-mentioned second bump may be a stud bump formed by wire bonding technology.

According to an embodiment of the present invention, the above-mentioned third bump may be a stud bump formed by wire bonding technology.

According to an embodiment of the present invention, the above-mentioned fourth bump may be a stud bump.

According to an embodiment of the present invention, all of the above-mentioned first bump, second bump, third bump and fourth bump may be stud bumps formed by wire bonding technology.

According to an embodiment of the present invention, the above-mentioned first bump, second bump, third bump and fourth bump may be made of gold.

As embodied and broadly described herein, the present invention further provides a stacked bump structure suitable for a substrate having a plurality of bonding pads disposed on a surface thereof. The bump structure includes a first bump, a second bump and a third bump. The first bump and the second bump are respectively disposed on any two adjacent bonding pads of the substrate. The third bump is stacked between the first bump and the second bump, so as to electrically connect the two adjacent bonding pads through the third bump.

According to an embodiment of the present invention, the pad pitch between the above-mentioned adjacent bonding pads is less than 70 μm.

According to an embodiment of the present invention, the above-mentioned bonding pads may have the same electrical property.

According to an embodiment of the present invention, the above-mentioned substrate may be a chip.

According to an embodiment of the present invention, the above-mentioned bonding pads may be aluminum pads.

According to an embodiment of the present invention, the above-mentioned first bump may be a stud bump.

According to an embodiment of the present invention, the above-mentioned second bump may be a stud bump.

According to an embodiment of the present invention, the above-mentioned third bump may be a stud bump.

According to an embodiment of the present invention, all of the above-mentioned first bump, second bump and third bump may be stud bumps.

According to an embodiment of the present invention, the above-mentioned first bump, second bump and third bump may be made of gold.

According to an embodiment of the present invention, the above-mentioned stacked bump structure further includes a fourth bump and a bonding wire. The fourth bump is disposed on another bonding pad. Both ends of the bonding wire are respectively connected to the third bump and the fourth bump, so as to electrically connect the another bonding pad to the above-mentioned two adjacent bonding pads through the bonding wire.

In light of the above, the stacked bump structure and the manufacturing method thereof utilize the wire bonding technology to form a bump between any two adjacent bonding pads, so as to make the two adjacent bonding pads electrically connected to each other through the bump. Accordingly, not only the interconnection reliability and the electrical performance between the bonding pads may be enhanced, but also the packaging density of devices may be increased. Further, the thickness of a substrate may be reduced, too. In addition, the manufacturing method of the stacked bump structure of the present invention may be applied to interconnection between multiple bonding pads, so that the multiple bonding pads are electrically connected to each other by the bumps and the bonding wire, and the wire loop curvature is not too large, thus resulting in a better interconnection performance between the bonding pads.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

FIGS. 2A~2D are schematic diagrams showing a method for manufacturing a stacked bump structure according to an embodiment of the present invention. The method for manufacturing a stacked bump structure of the embodiment includes the steps as follows. First referring to FIG. 2A, a substrate 200 (such as a chip) is provided, wherein a plurality of bonding pads 222, 224 and 226 (may be aluminum pads) are disposed on a surface 210 thereof and all the pads of 222, 224 and 226 have the same electrical property.

Figure 1:
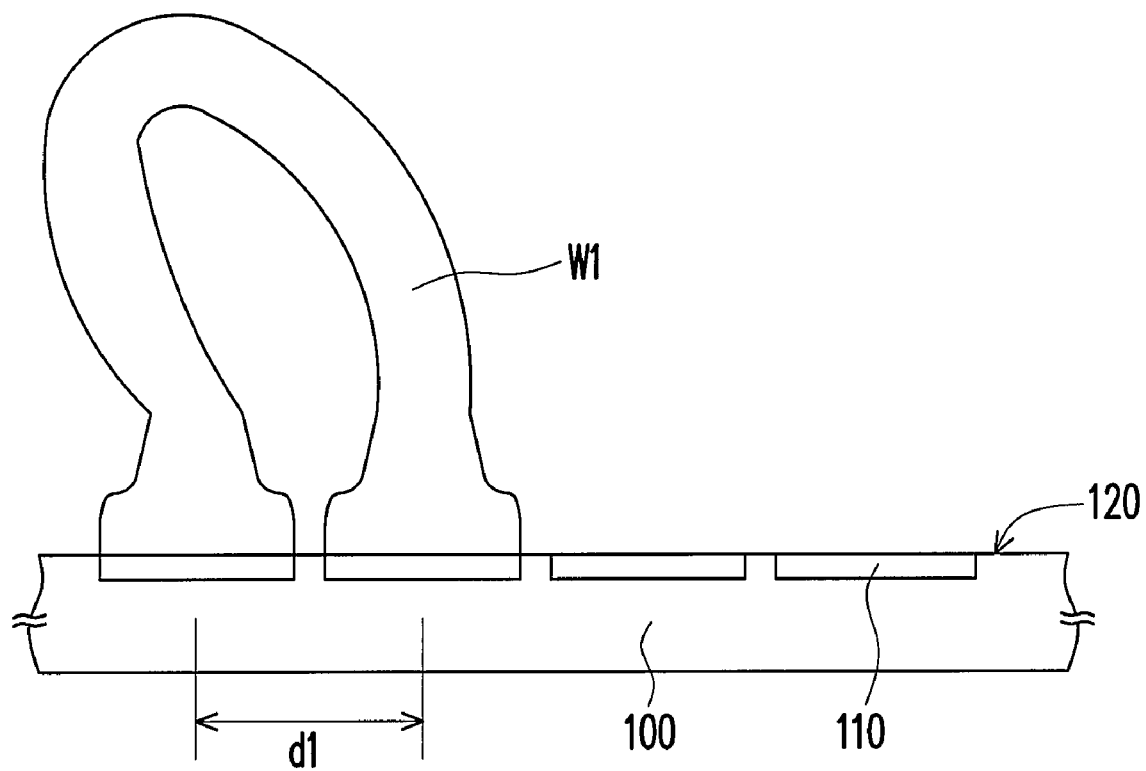
FIG. 1 is a schematic diagram showing a conventional chip using the stand-off stitch bonding.
Figure 2A:
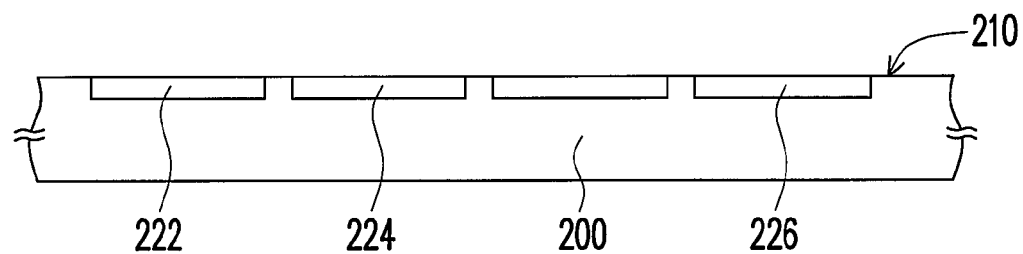
FIGS. 2A~2D are schematic diagrams showing a method for manufacturing a stacked bump structure according to an embodiment of the present invention.
Figure 2B:
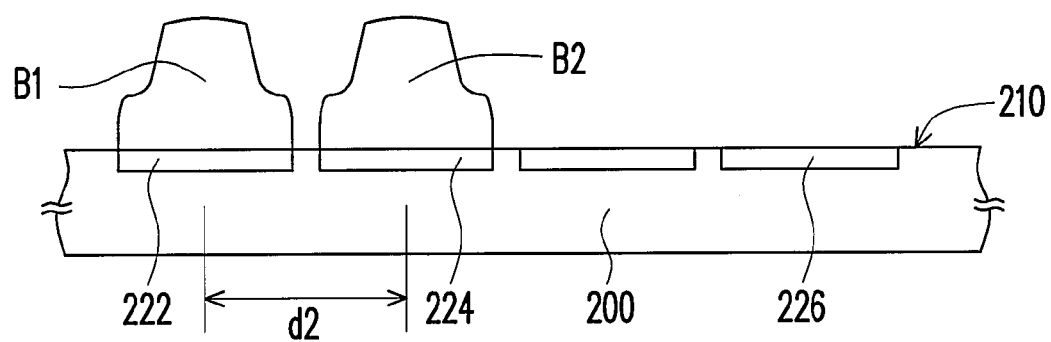

Next referring to FIG. 2B, a first bump B1 and a second bump B2 are respectively formed on any two adjacent bonding pads 222 and 224 of the substrate 200. In the embodiment, the space d2 between the bonding pads 222 and 224, i.e. the pad pitch of the substrate, may be less than 70 μm; the material of the first bump B1 and the second bump B2 may be gold, and the first bump B1 and the second bump B2 may be formed by using, for example, wire bonding technology, electroplating or other processes.

Figure 3A:
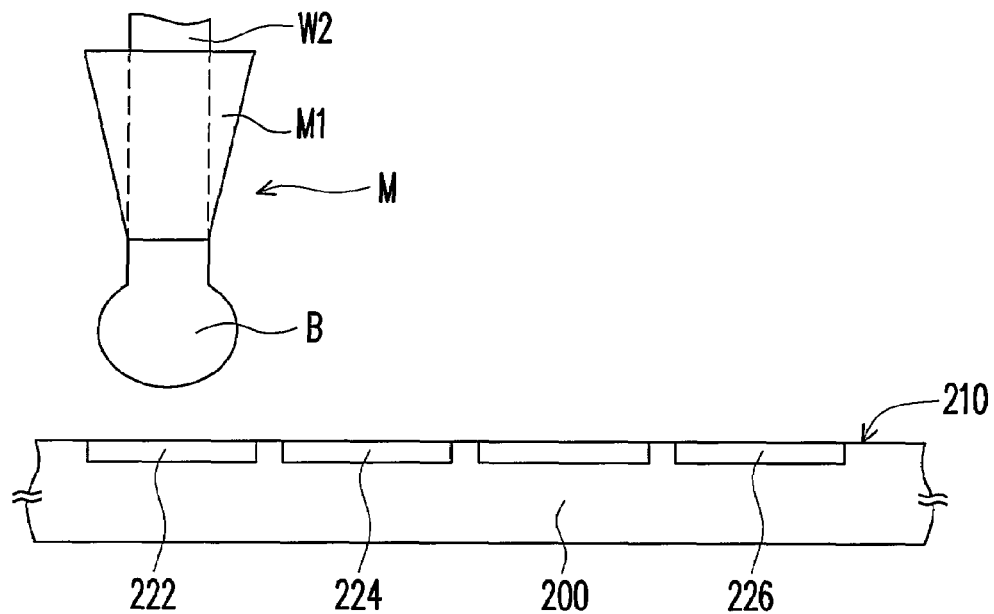
FIGS. 3A~3C are schematic diagrams showing how the first bump in FIG. 2B is formed by using wire bonding technology.
Figure 3B:
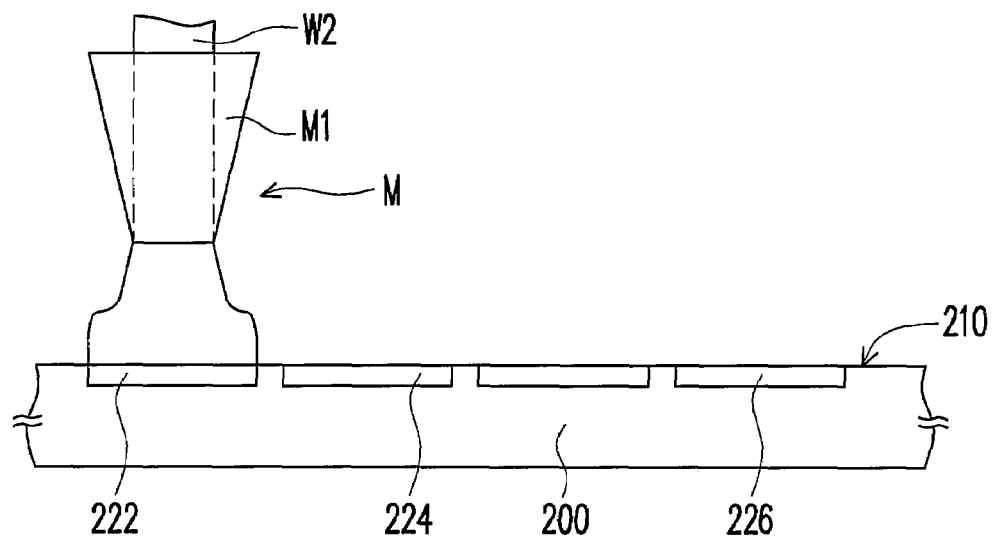
Figure 3C:
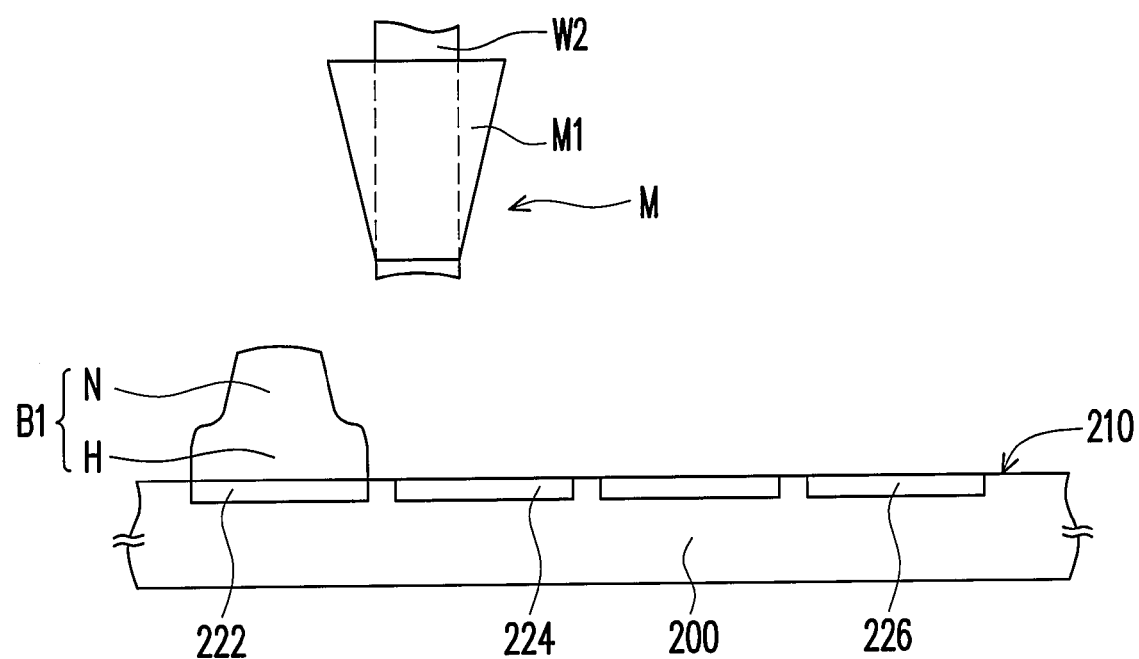

The process for forming the first bump B1 and the second bump B2 by wire bonding technology is described in detail as follows. FIGS. 3A~3C are schematic diagrams showing how the first bump in FIG. 2B is formed by wire bonding technology. First referring to FIG. 3A, a spherical object B is formed at one end of a fine wire W2 and at the tip of the steel mouth M1 of a capillary M. If the material of the fine wire W2 is gold, the spherical object B is a gold ball, too. Next referring to FIGS. 3A and 3B, the spherical object B is bond to the bonding pad 222 in press welding conducted by the capillary M through pressing the spherical object B. Afterwards referring to FIG. 3C, the steel mouth M1 of the capillary M quickly cuts off the fine wire W2 to form the first bump B1 on the bonding pad 222. It is noted that the first bump B1 usually takes a stud-like shape due to the shearing-off action produced by the steel mouth M1 of the capillary M. In other words, the first bump B1 takes a stud-like shape and has a head portion H and a bottleneck portion N. In terms of the forming process and the outlook of the second bump B2, they are normally the same as the first bump B1 and omitted to describe for simplicity herein.

After forming the first bump B1 and the second bump B2 as shown by FIG. 2B, the process goes on. Continuing to FIG. 2C, a third bump B3 (may be made of gold) is formed between the first bump B1 and the second bump B2 by wire bonding technology, so as to electrically connect the two adjacent bonding pads 222 and 224 through the third bump B3. In the embodiment, the third bump B3 may be a stud bump. It is noted that since all of the first bump B1, the second bump B2 and the third bump B3 are made of gold in the embodiment, a gold-gold eutectic bonding is generated between the first bump B1 and the third bump B3 and between the second bump B2 and the third bump B3, which makes the stacked bump structure S a better electrical performance.

Figure 2C:
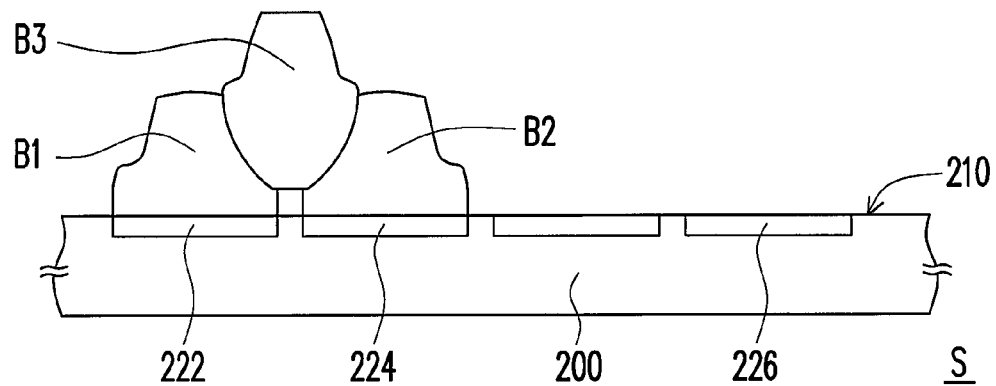

Once the above-described steps shown by FIGS. 2A~2C are completed, a basic stacked bump structure S is formed. Thereafter, the electrical connections between the first bump B1/the second bump B2 and the other bonding pads are established by the following process according to the present invention.

Figure 2D:
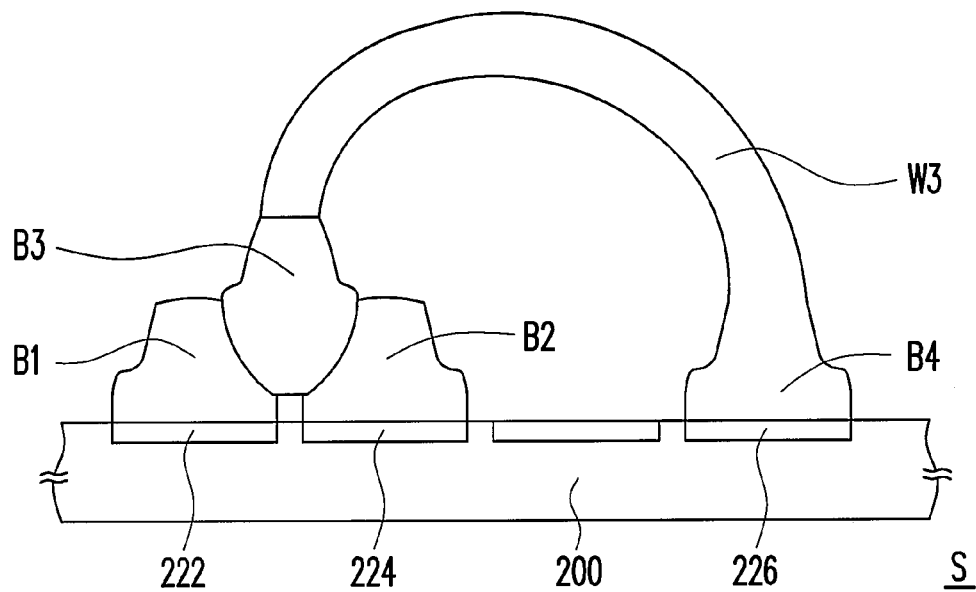

FIG. 2D is a schematic diagram showing the fabrication of a fourth bump on one of the bonding pads and a bonding wire connected thereto by using wire bonding technology. Referring to FIG. 2D, first, a fourth bump B4 is formed on another bonding pad 226. The forming process and the outlook of the fourth bump B4 are normally the same as the first bump B1 and omitted to describe for simplicity herein. Next, a bonding wire W3 is formed between the third bump B3 and the fourth bump B4 by wire bonding technology, wherein the bonding wire W3 serves as a bridge to respectively electrically connect the bonding pad 226 to the above-mentioned two adjacent pads. 222 and 224. Note that if the fourth bump B4 is formed by wire bonding technology, it allows not to cut off the fine wire W2 after forming the fourth bump B4 (referring to FIGS. 3B and 3C); instead, the fine wire W2 is bond to the third bump B3 by using pull welding (backhand welding) along a designed loop path to form a bonding wire W3, followed by cutting off the bonding wire W2. In other words, the fine wire W2 is cut off only after sequentially forming the fourth bump B4 and the bonding wire W3.

After the above-described step of FIG. 2D, the stacked bump structure S further includes the fourth bump B4 and the bonding wire W3 electrically connecting the third bump B3 and the fourth bump B4. It may be seen from FIG. 2D, since the wire loop curvature of the bonding wire W3 is not too large, the bonding wire W3 is unlikely to be faulted, which further sustains the good electrical connection between the bonding pads 222, 224 and 226.

Figure 4A:
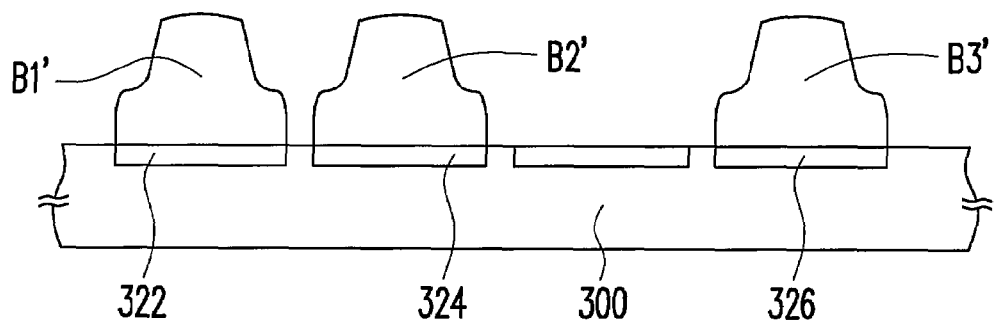
FIGS. 4A and 4B are schematic diagrams showing a method for manufacturing a stacked bump structure according to another embodiment of the present invention.
Figure 4B:
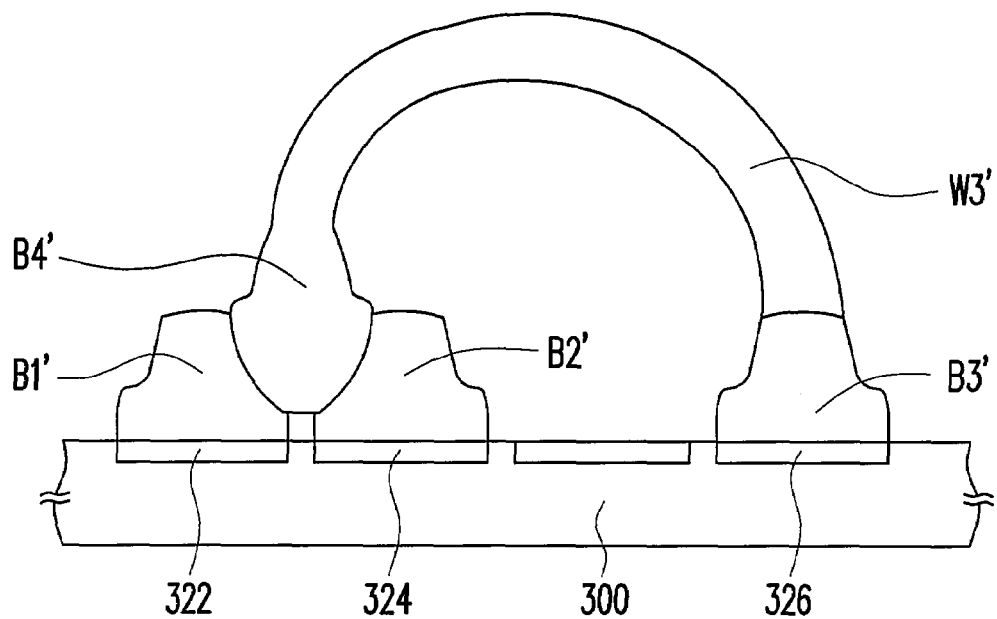

FIGS. 4A and 4B are diagrams of a manufacturing flowchart according to another embodiment of the present invention, where a first bump, a second bump and a third bump are formed first on the bonding pads of a substrate, followed by forming a bonding wire by wire bonding technology to electrically connect the third bump to the first bump and the second bump though the bonding wire. The difference of the present embodiment from the above-described embodiment is that the sequence of the processes is changed.

Referring to FIG. 4A, after a step similar to the FIG. 2A is done, i.e. after a substrate 300 is provided, and a first bump B1' and a second bump B2' are respectively formed on any two adjacent bonding pads 322 and 324. A third bump B3' is formed on another pad 326. Next, referring to FIG. 4B, a fourth bump B4' and a bonding wire W3' are formed by wire bonding technology, wherein the fourth bump B4' is formed between the first bump B1' and the second bump B2', and the bonding wire W3' is used to connect the third bump B3' to the fourth bump B4. Therefore, the bonding pad 326 is able to electrically connect the above-mentioned two adjacent pads 322 and 324 through the bonding wire W3'.

Figure 5:
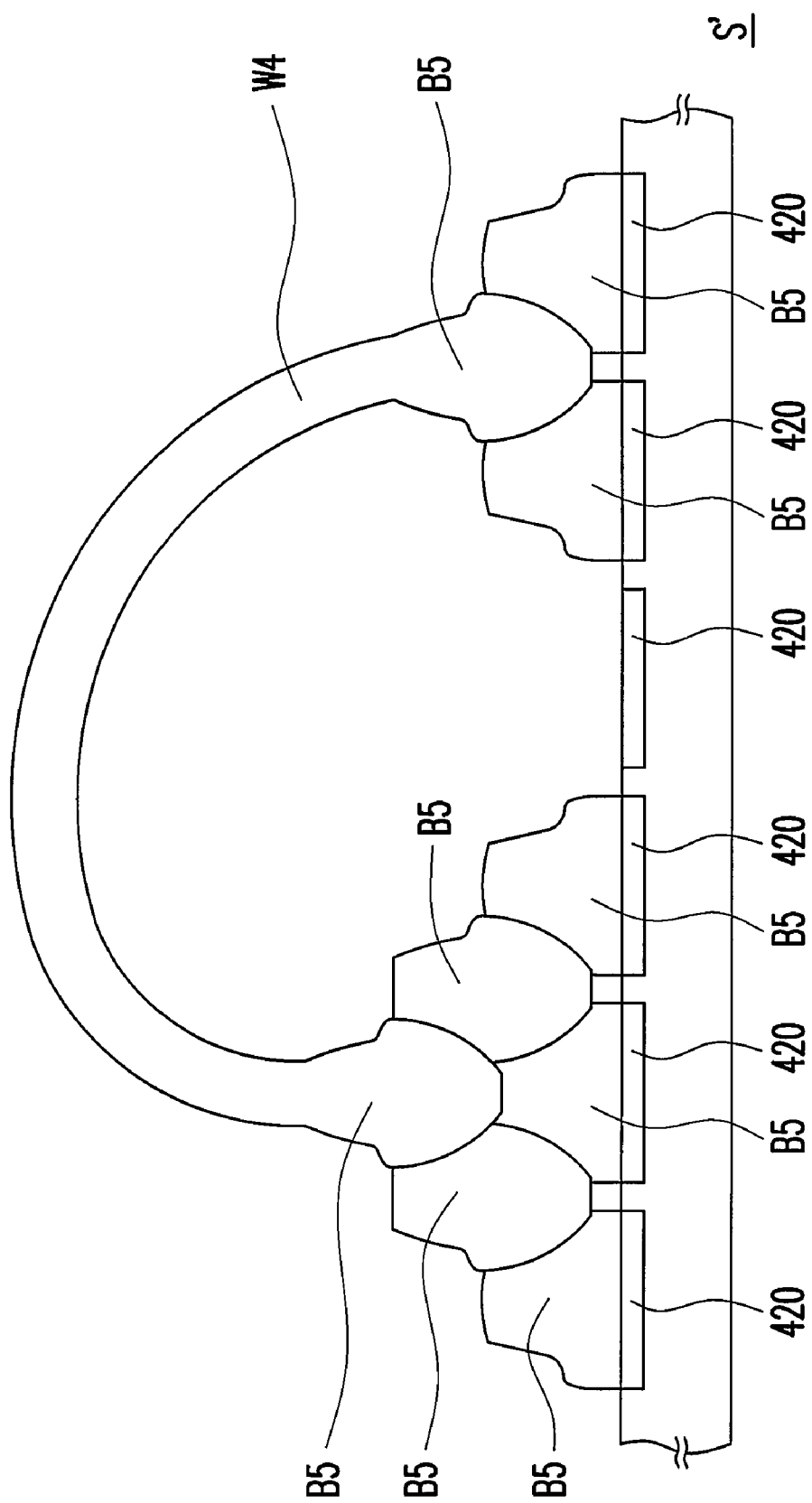
FIG. 5 is a schematic diagram of a stacked bump structure according to another embodiment of the present invention.

FIG. 5 is a schematic diagram of a stacked bump structure according to another embodiment of the present invention. Referring to FIG. 5, the stacked bump structure S' of the embodiment includes nine bumps B5 and a bonding wire W4. The difference between the stacked bump structure S' and the stacked bump structure S (as shown in FIG. 2D) is that the five bonding pads 420 are electrically connected to each other through the bumps B5 and the bonding wire W4 in the structure S'. The stacked bump structures S and S' described herein are considered as exemplary only. The electrical connections between the bonding pads in a real application may be figured out according to the design requirement, where the numbers of the bumps and the bonding wires and the connection manner thereof may be adjusted to achieve the expected electrical connection performance.

In summary, the stacked bump structure and the manufacturing method thereof of the present invention have at least the following advantages:

1. Since the eutectic bonding is generated between the bumps on the adjacent bonding pads and the bump between the adjacent bonding pads, thus, the interconnection reliability between the bonding pads and the electrical performance thereof may be enhanced.

2. Since the multiple adjacent bonding pads may be electrically connected to one another through the bumps, thus, the packaging density of devices is increased and the substrate thickness is reduced.

3. Since the multiple bonding pads may be electrically connected to one another through the bumps and the bonding wire with a moderate curvature, thus, the bonding pads have better electrical connection performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked bump structure, suitable for a substrate having a plurality of bonding pads disposed on a surface thereof, the bump structure comprising:
    a first bump and a second bump, disposed on any two adjacent bonding pads of the substrate, respectively;
    a third bump, stacked between the first bump and the second bump, so as to make the two adjacent bonding pads electrically connected to each other through the third bump;
    a fourth bump, disposed on another bonding pad of the substrate; and
    a bonding wire, both ends of which are respectively connected to the third bump and the fourth bump, so as to make the another bonding pad electrically connected to the above-mentioned two adjacent bonding pads through the bonding wire.

2. The stacked bump structure as recited in claim 1, wherein the pad pitch is less than 70 μm.

3. The stacked bump structure as recited in claim 1, wherein the bonding pads have the same electrical property.

4. The stacked bump structure as recited in claim 1, wherein the substrate is a chip.

5. The stacked bump structure as recited in claim 1, wherein the bonding pads are aluminum pads.

6. The stacked bump structure as recited in claim 1, wherein the first bump is a stud bump.

7. The stacked bump structure as recited in claim 1, wherein the second bump is a stud bump.

8. The stacked bump structure as recited in claim 1, wherein the third bump is a stud bump.

9. The stacked bump structure as recited in claim 1, wherein all of the first bump, the second bump and the third bump are stud bumps.

10. The stacked bump structure as recited in claim 1, wherein a material of the first bump, the second bump and the third bump comprises gold.

* * * * *